US006735109B2

United States Patent
Jo (10) Patent No.: US 6,735,109 B2
(45) Date of Patent: May 11, 2004

(54) UNI-TRANSISTOR RANDOM ACCESS MEMORY DEVICE AND CONTROL METHOD THEREOF

(75) Inventor: Seong-Kue Jo, Suwon-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/356,444

(22) Filed: Feb. 3, 2003

(65) Prior Publication Data

US 2003/0147271 A1 Aug. 7, 2003

(30) Foreign Application Priority Data

Feb. 7, 2002 (KR) .................. 10-2002-0007074

(51) Int. Cl.⁷ ............... G11C 12/24; G11C 7/00

(52) U.S. Cl. ........................ 365/149; 365/203
(58) Field of Search .................. 365/149, 203, 365/207

(56) References Cited

U.S. PATENT DOCUMENTS 6,344,990 B1 * 2/2002 Matsumiya et al. .......... 365/63
6,449,182 B1 * 9/2002 Ooishi ......................... 365/63

* cited by examiner

*Primary Examiner*—Thong Q. Le
(74) *Attorney, Agent, or Firm*—F. Chau & Associates, LLC

(57) ABSTRACT

An SRAM device according to the present invention includes at least one twin cell to which first and second bitlines are coupled. The first and second bitlines are precharged to a power supply voltage for an array via a sense and amplifier circuit before/after a read, write or refresh operation.

14 Claims, 9 Drawing Sheets

(Prior Art)

UNI-TRANSISTOR RANDOM ACCESS MEMORY DEVICE AND CONTROL METHOD THEREOF

BACKGROUND

1. Field of the Invention

The present invention relates to semiconductor memory devices and, more particularly, to a static random access memory device using two DRAM cells as one memory cell.

2. Discussion of Related Art

Figure 1:
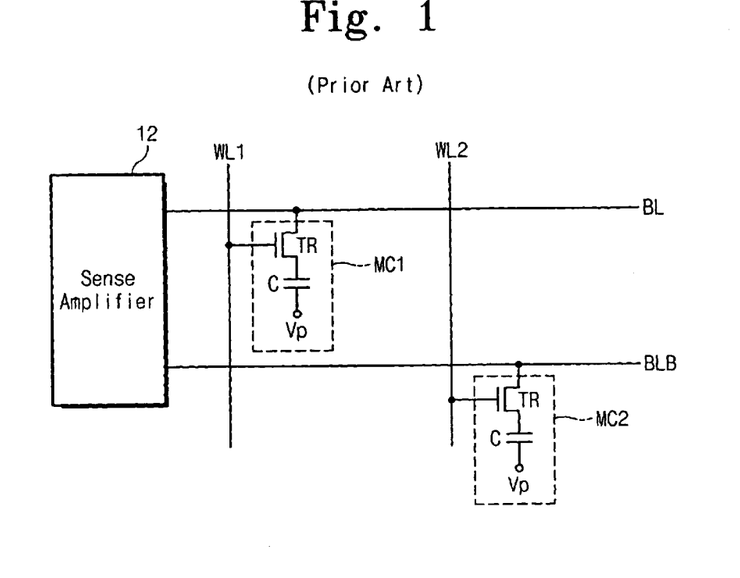
FIG. 1 shows a conventional DRAM cell structure.

FIG. 1 shows a uni-DRAM cell structure. In FIG. 1, two of the DRAM cells (MC1, MC2) or memory cells are illustrated. Each of the DRAM cells includes one cell transistor TR and one cell capacitor C. In a DRAM cell MC1, a gate of the cell transistor is coupled to a wordline WL1, and a current path of the cell transistor is formed between a bitline BL and one electrode of the cell capacitor. The other electrode of the cell transistor is coupled to a voltage Vp. In a DRAM cell MC2, a gate of the cell transistor is coupled to a wordline WL2, and a current path of the cell transistor is formed between a bitline BLB and one electrode of the cell capacitor. The other electrode of the cell capacitor is coupled to the voltage. The bitlines (BL, BLB) are coupled to a sense amplifier 12.

In the DRAM cell structure of FIG. 1, when the wordline WL1 is selected, cell data stored in the cell capacitor of the DRAM cell MC1 is transferred to the bitline BL by means of charge sharing. Typically, the bitlines (BL, BLB) are precharged to half a power supply voltage for an array (AIVC), i.e., AIVC/2, prior to a sensing operation. A potential of the bitline BL is increased or decreased by the charge sharing. When data of "1" is stored in the memory cell MC1, the potential of the bitline is increased by the charge sharing. When data of "0" is stored in the memory cell MC1, the potential of the bitline is decreased by the charge sharing. In this case, the sense amplifier 12 senses and amplifies a potential difference between the bitlines (BL, BLB).

It is well known in the art that since cell data may be damaged by leakage current resulting from the characteristic of the DRAM cell structure, electric charges stored in a cell capacitor may be reduced. For this reason, a potential difference between the bitlines is reduced such that it is impossible to carry out a normal sensing operation, and a refresh fail occurs. Thus, the DRAM cell structure requires a refresh operation for maintaining stored data. A refresh cycle of a DRAM cell comprising one cell capacitor and one cell transistor is determined on the basis of a refresh time ($t_{REF}$) of cell data "1". Here the "refresh time" means the maximum time that data stored in a memory cell can be maintained.

One way to realize a reduced power consumption in a semiconductor memory device adopting a DRAM cell structure is to prolong a refresh time or cycle. The refresh time or cycle may be extended by adopting a twin cell structure. A twin cell structure well known in the art is illustrated in FIG. 2.

Figure 2:
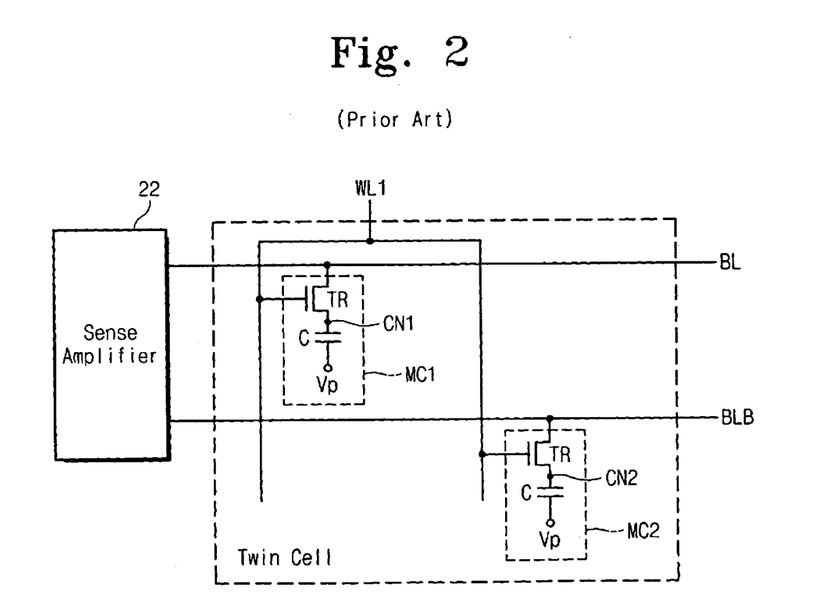
FIG. 2 and FIG. 3 show conventional twin cell array structures.

Referring to FIG. 2, a twin cell includes two DRAM cells (MC1, MC2) each having one cell transistor and one cell capacitor. In the DRAM cell MC1, a gate of the cell transistor is coupled to a wordline WL1. A current path of the cell transistor is formed between a bitline BL and one electrode of the cell capacitor. The other electrode of the capacitor is coupled to a voltage Vp. In the DRAM cell MC2, a gate of the cell transistor is coupled to the wordline WL1. A current path of the cell transistor is formed between a bitline BLB and one electrode of the cell capacitor. The other electrode of the capacitor is coupled to the voltage Vp. The bitlines (BL, BLB) are coupled to a sense amplifier 22. DRAM cells constituting the twin cell store complementary data. For example, when the DRAM cell MC1 stores cell data "1", the DRAM cell MC2 stores cell data "0". On the other hand, when the DRAM cell MC1 stores cell data "0", the DRAM cell MC2 stores cell data "1".

Figure 3:
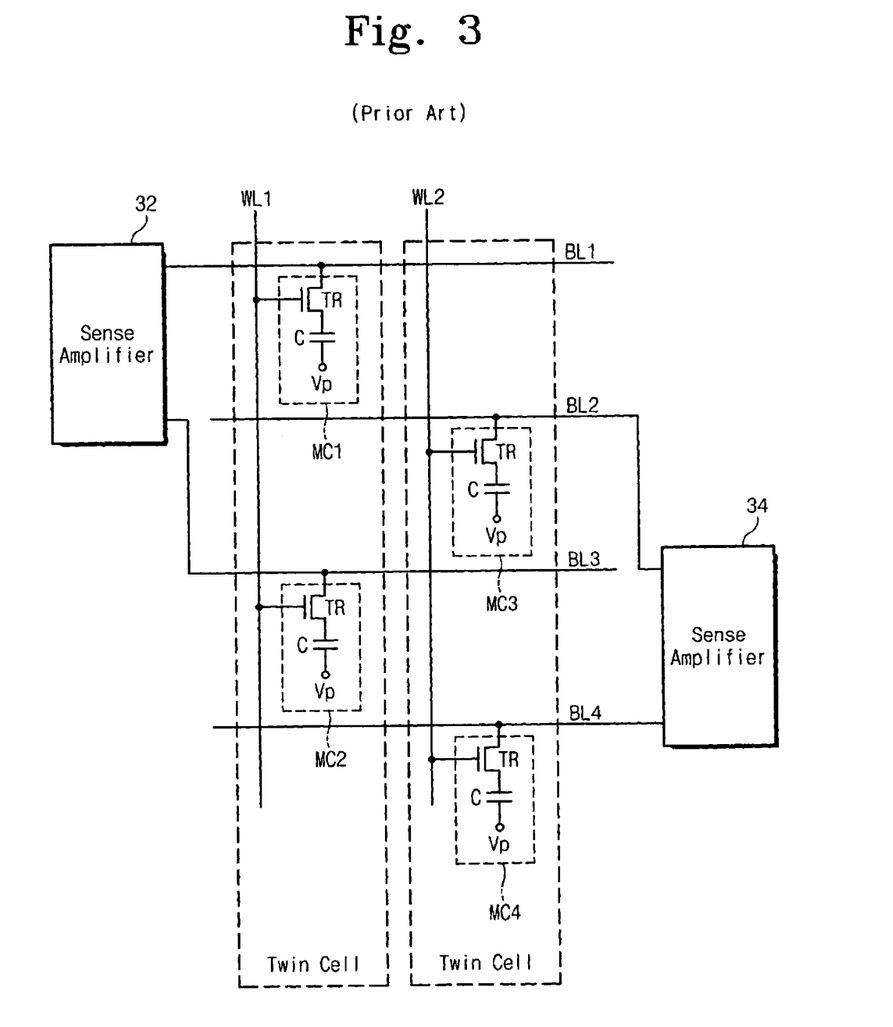

Referring to FIG. 3 showing another twin cell structure, each of DRAM cells (MC1–MC4) has one cell transistor and one cell capacitor. In the DRAM cell MC1, a gate of the cell transistor is coupled to a wordline WL1. A current path of the cell transistor is formed between a bitline BL1 and one electrode of the cell capacitor. In the DRAM cell MC2, a gate of the cell transistor is coupled to the wordline WL1. A current path of the cell transistor is formed between a bitline BL3 and one electrode of the cell capacitor. The bitlines (BL1, BL3) are coupled to a sense amplifier 32. The DRAM cells (MC1, MC2) constitute a twin cell. In the DRAM cell MC3, a gate of the cell transistor is coupled to a wordline WL2. A current path of the cell transistor is formed between the bitline BL2 and one electrode of the cell capacitor. In the DRAM cell MC4, a gate of the cell transistor is coupled to the wordline WL2. A current path of the cell transistor is formed between the bitline BL4 and one electrode of the cell capacitor. The bitline (BL2, BL4) are coupled to a sense amplifier 34. The DRAM cells (MC3, MC4) constitute a twin cell. DRAM cells each constituting a twin cell store complementary data. Thus, a semiconductor memory device adopting the twin cell structure has a longer refresh cycle or time than a semiconductor memory device adopting a uni-cell structure. This is explained in detail below.

Figure 4:
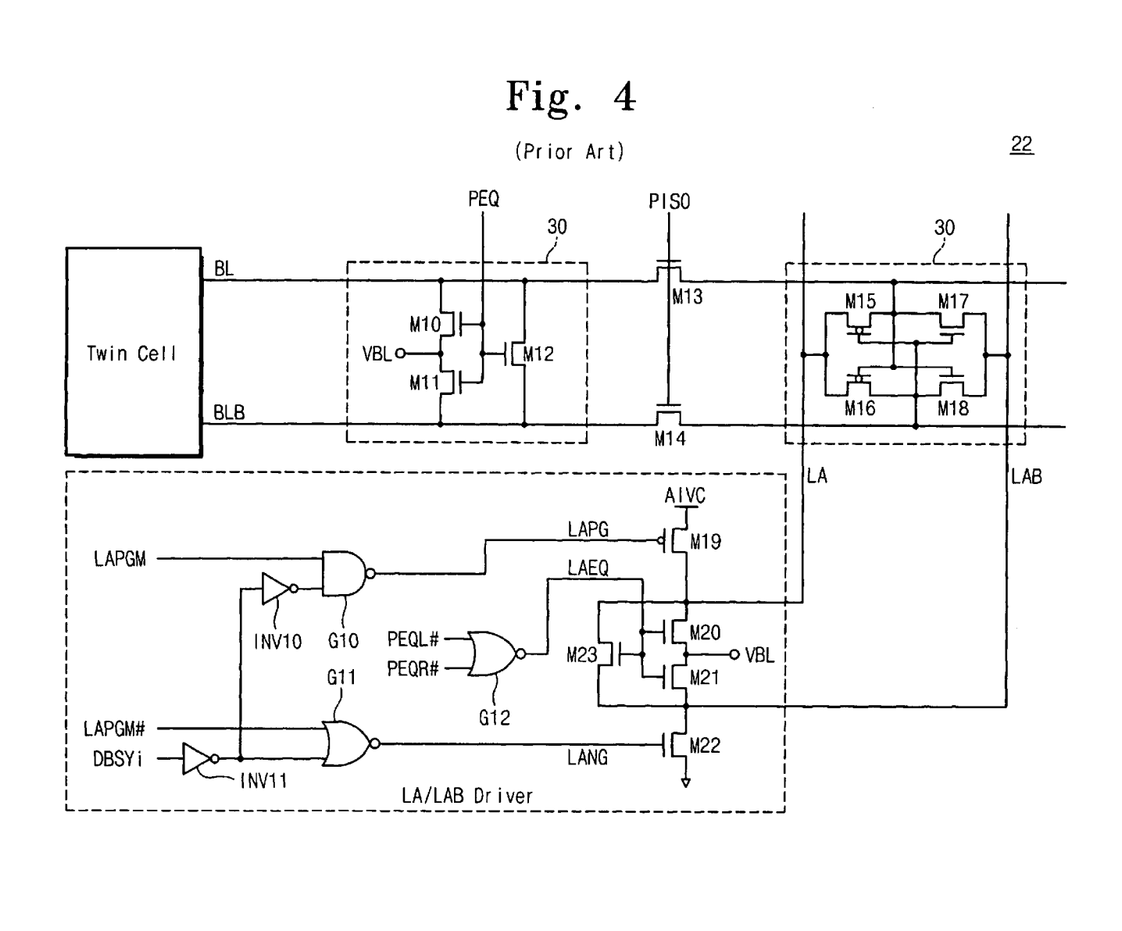
FIG. 4 is a circuit diagram of a sense amplifier and a driver of an SRAM device having a conventional twin cell array structure.
Figure 5:
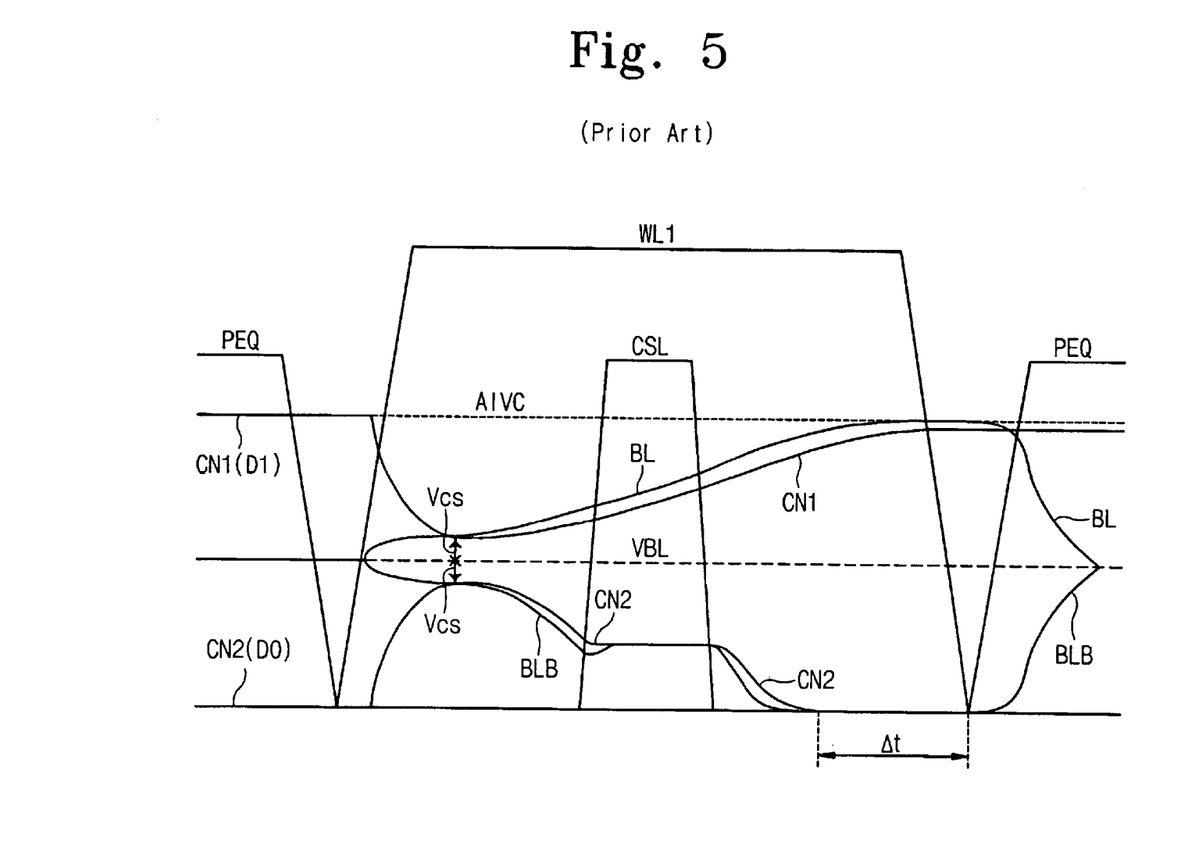
FIG. 5 is a timing diagram of a read operation of an SRAM device having a conventional twin cell array structure.

FIG. 4 is a circuit diagram showing a conventional sense amplifier, and FIG. 5 is a timing diagram for explaining a read operation of an SRAM device having a twin cell structure. The read operation of the SRAM device is now described with reference to FIG. 2, FIG. 4, and FIG. 5. Prior to activation of a wordline WL1, bitlines BL and BLB are precharged to a precharge voltage VBL, i.e., AIVC/2, through a bitline precharge unit 30. It is assumed that cell data "1" is stored in a DRAM cell MC1 and cell data "0" is stored in a DRAM cell MC2. Under this assumption, a node CN1, i.e., a connection node of a cell capacitor and a transistor, of the DRAM cell MC1 has a power supply voltage (AIVC) corresponding to the cell data "1", and a cell node CN2 of the DRAM cell MC2 has a ground voltage GND corresponding to the cell data "0". As the wordline WL1 is activated, charge sharing is established between the bitline BL and a cell capacitor of the DRAM cell MC1 as well as between the bitline BLB and a cell capacitor of the DRAM cell MC2. From the charge sharing, a voltage of the bitline BL is increased by voltage $V_{CS}$ (meaning a voltage gained by subtracting a precharge voltage VBL from a charge-shared bitline voltage) and a voltage of the bitline BLB is decreased by the voltage $V_{CS}$, as shown in FIG. 5.

Following the charge sharing operation, when a voltage difference between the bitlines (BL, BLB) is sufficiently amplified, a column selection line CSL is activated, as shown in FIG. 5. As the column selection line is activated, input/output lines and the bitlines are electrically connected to each other. Since an input/output line having a high loading capacitance is precharged to internal power supply voltage IVC, voltages of the bitline BLB and the cell node CN1, which drop toward the ground voltage, are clamped to a specific voltage level. In this case, the voltages of the bitline and the cell node are scarcely affected by the activation of the column selection line. Following inactivation of the column selection line, voltages of the bitline BLB and the cell node CN2 drop to the ground voltage. If the cell data "1" and the cell data "0" are re-stored in the cell nodes (CN1, CN2) according to the voltages of the bitlines (BL, BLB), the wordline WL1 is inactivated and the bitlines are precharged to the precharge voltage VBL.

As described above, since DRAM cells each constituting a twin cell store complementary data, a double voltage difference is made between bitlines as compared to a uni-cell structure. As shown in FIG. 5, the bitline BL coupled to the DRAM cell MC1 storing the cell data "1" is increased by $V_{CS}$ by way of the charge sharing, while the bitline BLB coupled to the DRAM cell MC2 storing the cell data "0" is decreased by $V_{CS}$ by way of the charge sharing. From the standpoint of the sense amplifier 12, the voltage difference between the bitlines (BL, BLB) is $2V_{CS}$. Therefore, in a twin cell structure, the criterion to decide a refresh cycle or time is not needed. Further, a normal sensing operation may be performed even if a potential of a cell node of a DRAM cell storing the cell data "1" becomes lower than a bitline precharge voltage by leakage current. This leads to rapid increase in refresh time or cycle of a semiconductor memory device adopting the twin cell structure. For example, the twin cell structure has the refresh cycle or time ($t_{REF}$) of several seconds, while the uni-cell structure has the refresh time of 100–200 ms. For this reason, stand-by current of the memory device adopting the twin cell structure can be remarkably reduced.

Although representative semiconductor memory devices adopting a twin cell structure are DRAM devices, static random access memory devices (hereinafter referred to as "SRAM" devices) can be realized by adopting the same. An SRAM device adopting the twin cell structure is disclosed in the data sheet of product number "K1S321615M" (May, 2001) of Samsung Electronics Co., Ltd., entitled "2M×16 bit Uni-Transistor Random Access Memory", which is a so-called "UtRAM". The SRAM devices adopting the twin cell structure are constructed internally in the same way as the DRAM devices. Meanwhile, an externally supplied command is identical with that of the SRAM device. Unlike a DRAM device adopting the twin cell structure, the SRAM device adopting the twin cell structure has no special external command for a refresh operation. Typically, the refresh operation of the SRAM device adopting the twin cell structure is automatically carried out through control means constructed therein without an external refresh command. As is well known in the art, the refresh operation is substantially identical with the read operation except that sensed data is not outputted to an exterior.

In the case of the SRAM device adopting the twin cell structure, since a refresh operation is carried out without an external refresh command, the refresh operation of at least one clock cycle is needed even though a read/write command is inputted. This may result in loss or damage of stored data. Consequently, access time or speed of the SRAM device adopting the twin cell structure becomes comparatively slow. Therefore, in the case of the SRAM device adopting the twin cell structure, there is a need for a novel control method to enhance the access time or access speed.

SUMMARY OF THE INVENTION

The present invention is directed to an SRAM device having a DRAM cell structure and to a method of controlling operations of a static random access memory device, capable of reducing a chip size.

According to an embodiment of the present invention, a first bitline coupled to a first cell transistor and a second bitline coupled to a second cell transistor are charged to a first voltage. After activating a wordline commonly coupled to the first and second cell transistors, a difference between voltage on the first bitline and voltage on the second bitline is sensed and amplified. Finally, when the voltage on one of the first and second bitlines is equivalent to a second voltage lower than the first voltage, an activated wordline is inactivated. The first voltage is a power supply voltage for an array, and the second voltage is a ground voltage. A charge operation is carried out before or after a read, write or refresh operation.

According to an embodiment of the present invention, a static random access memory device comprises a plurality of twin cells, a row selection circuit, a bitline precharge circuit, and a sense amplifier circuit. The twin cells are arranged in a matrix of rows and columns. Each of the twin cells has a first memory cell and a second memory cell. The row selection circuit activates one of the rows in response to a row address, and inactivates an activated row until voltage on one of the first and second bitline reaches a ground voltage. The bitline precharge circuit charges first and second bitlines of each of the columns to a power supply voltage in response to a precharge control signal. The sense amplifier circuit senses and amplifies a voltage difference between the first and second bitlines of each column.

In this embodiment, the first bitline is coupled to a first cell capacitor through a first cell transistor. The second bitline is coupled to a second cell capacitor through the second cell transistor. The first cell transistor and the first capacitor constitute a first memory cell. The second cell transistor and the second cell capacitor constitute a second memory cell. The first and second memory cells constitute a twin cell.

In this embodiment, the sense amplifier circuit is coupled to the first bitline, the second bitline, the power supply voltage, and a signal line. The signal line is driven by a line driver to have one of the power supply voltage and the ground voltage.

In this embodiment, the power supply voltage is used for an array that includes the twin cells.

DESCRIPTION OF PREFERRED EMBODIMENTS

According to an embodiment of the present invention, bitlines coupled to one twin cell are precharged substantially to the power supply voltage for an array. The time required for precharging memory cells to voltages on the bitlines in read/refresh operations is based on the time required for recharging a cell node of a memory cell associated with low-level data to a ground voltage. Therefore, as the bitlines are precharged to the power supply voltage for an array, a wordline activation point is based on the time required for recharging the cell node thereof. On the other hand, in a case where the bitlines are precharged to half the power supply voltage for an array, time required for recharging the memory cells to the voltages on the bitlines in the read/refresh operations is based on time required for recharging a cell node of a memory cell associated with high-level data to the power supply voltage for an array. Therefore, the wordline activation point is based on the time required for precharging the cell node associated with the high-level data to the power supply voltage for an array.

In brief, in a case where the bitlines are precharged to the power supply voltage for an array, the wordline activation point is reduced by a time difference Δt (see FIG. 5) between a re-storing finish time of the low-level data and a re-storing finish time of high-level data.

Figure 6:
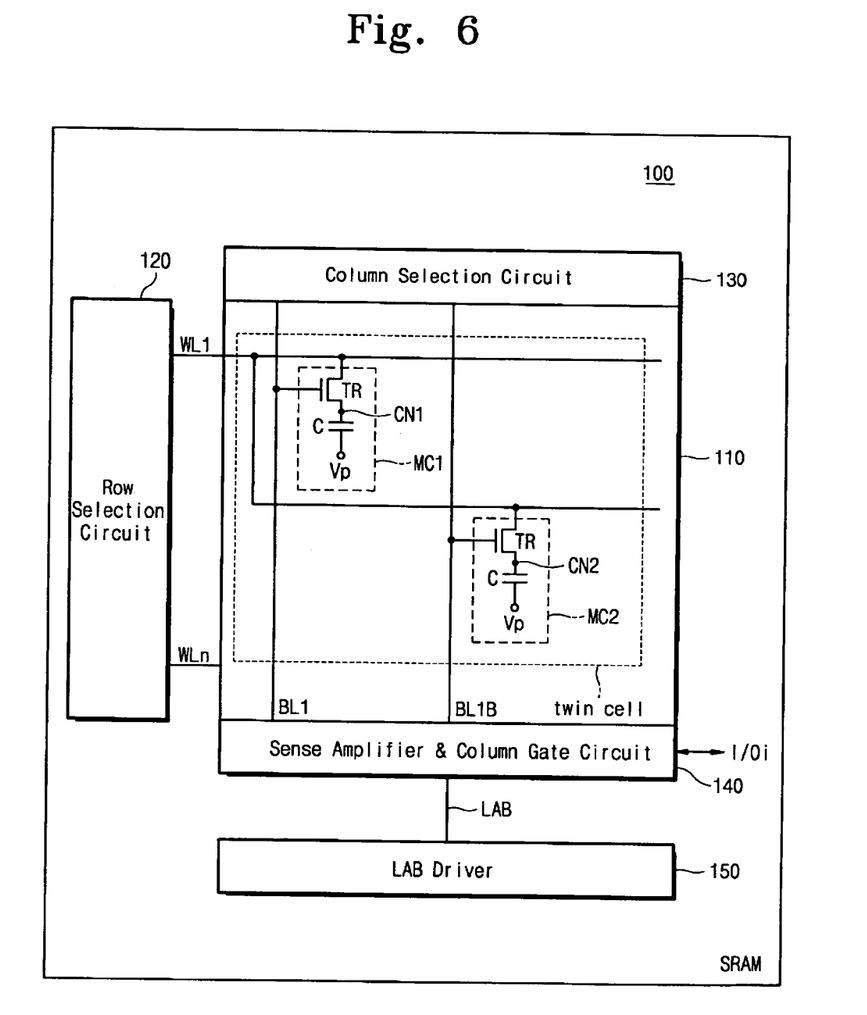
FIG. 6 is a block diagram of an SRAM device according to an embodiment of the present invention.

An SRAM device having a DRAM cell structure according to an embodiment of the invention is schematically illustrated in FIG. 6. Referring to FIG. 6, an SRAM device 100 includes a memory cell array 110 having a plurality of twin cells arranged in a matrix of rows and columns. Each of the twin cells has two DRAM cells each comprising one cell transistor and one cell capacitor. The SRAM device 100 further includes a row selection circuit 120, a sense amplifier and column gate circuit 140, a column selection circuit 130, and a driver circuit 150. The row selection circuit 120 selects one of rows (or wordlines) arranged at the memory cell array 110 in response to a row address, and activates a selected row. The sense amplifier and column gate circuit 140 senses and amplifies data stored in twin cells coupled to the selected row using voltage LAB from the driver circuit 150, and outputs sensed data to input/output lines I/Oi under control of the column selection circuit 130.

According to this embodiment, prior to read/write operations, columns (or bitlines) arranged at the memory cell array 110 are precharged with a predetermined voltage. It is preferable to use a power supply voltage for an array (AIVC) as a bitline precharge voltage. By so doing, an access time/speed of an SRAM device having a DRAM cell structure can be enhanced.

Figure 7:
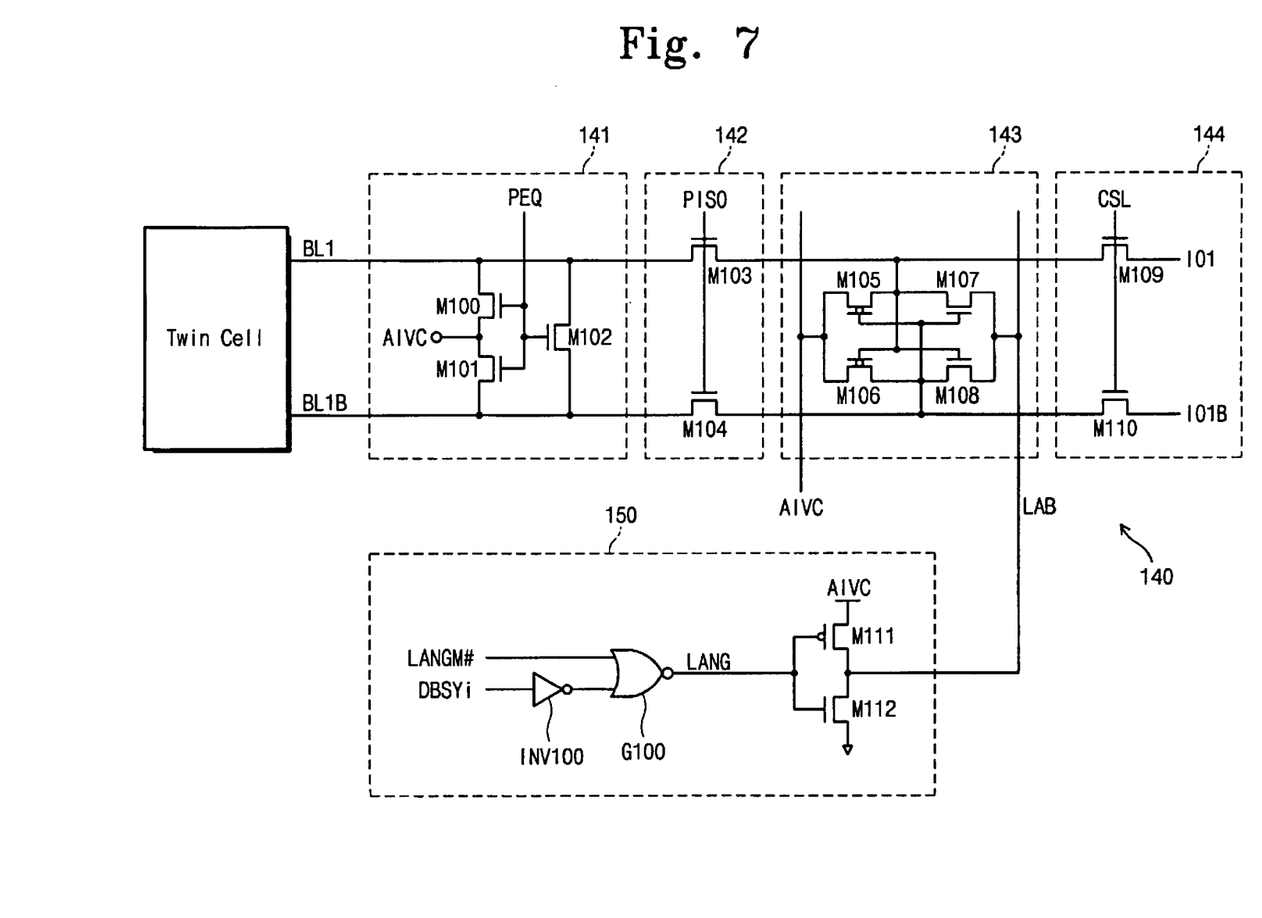
FIG. 7 is a circuit diagram of a sense amplifier and column gate circuit and a driver shown in FIG. 6.

FIG. 7 is a detailed circuit diagram of a sense amplifier and column gate circuit and a driver circuit shown in FIG. 6. Referring to FIG. 7, a twin cell is coupled to bitlines (BL1, BL1B). The bitlines are electrically connected to or disconnected from input/output lines (IO1, IO1B) through the sense amplifier and column gate circuit 140. The sense amplifier and column gate circuit 140 includes a bitline precharge section 141, a bitline isolation section 142, a bitline sense amplifier section 143, and a column gate 144.

The bitline precharge section 141 is coupled between the bitlines (BL1, BL1B), and has three NMOS transistors (M100, M101, and M102). In response to a precharge control signal PEQ, the bitline precharge section 141 precharges the bitlines to a predetermined voltage. Unlike the precharge unit 30 shown in FIG. 4, the bitline precharge section 141 precharges the bitlines (BL1, BL1B) to a power supply voltage for an array (AIVC). The bitline isolation section 142 has NMOS transistors (M103, M104), and electrically connects the bitlines to the bitline sense amplifier section 143 in response to a control signal PISO. The bitline sense amplifier section 143 has PMOS transistors (M105, M106) and NMOS transistors (M107, M108), which are connected as shown in FIG. 7. The bitline sense amplifier section 143 is coupled to the bitlines, the power supply voltage for an array (AIVC), and an LAB line. The LAB line is coupled to the driver circuit 150, and is driven to the power supply voltage for an array (AIVC) or a ground voltage. The column gate 144 has NMOS transistors (M109, M110), and electrically connects the bitlines to input/output lines in response to a column selection signal.

Since the bitlines (BL1, BL1B) are precharged to the power supply voltage, sources of the pull-up PMOS transistors (M105, M106) are not driven through a special driver (see FIG. 4) and are directly coupled to the power supply voltage for an array (AIVC). Therefore, the driver circuit 150 may occupy a small area, as compared to the driver circuit shown in FIG. 4. In the case of an SRAM device having a sub-array structure, the more the number of sub-arrays increases, the smaller a chip size is.

Figure 8:
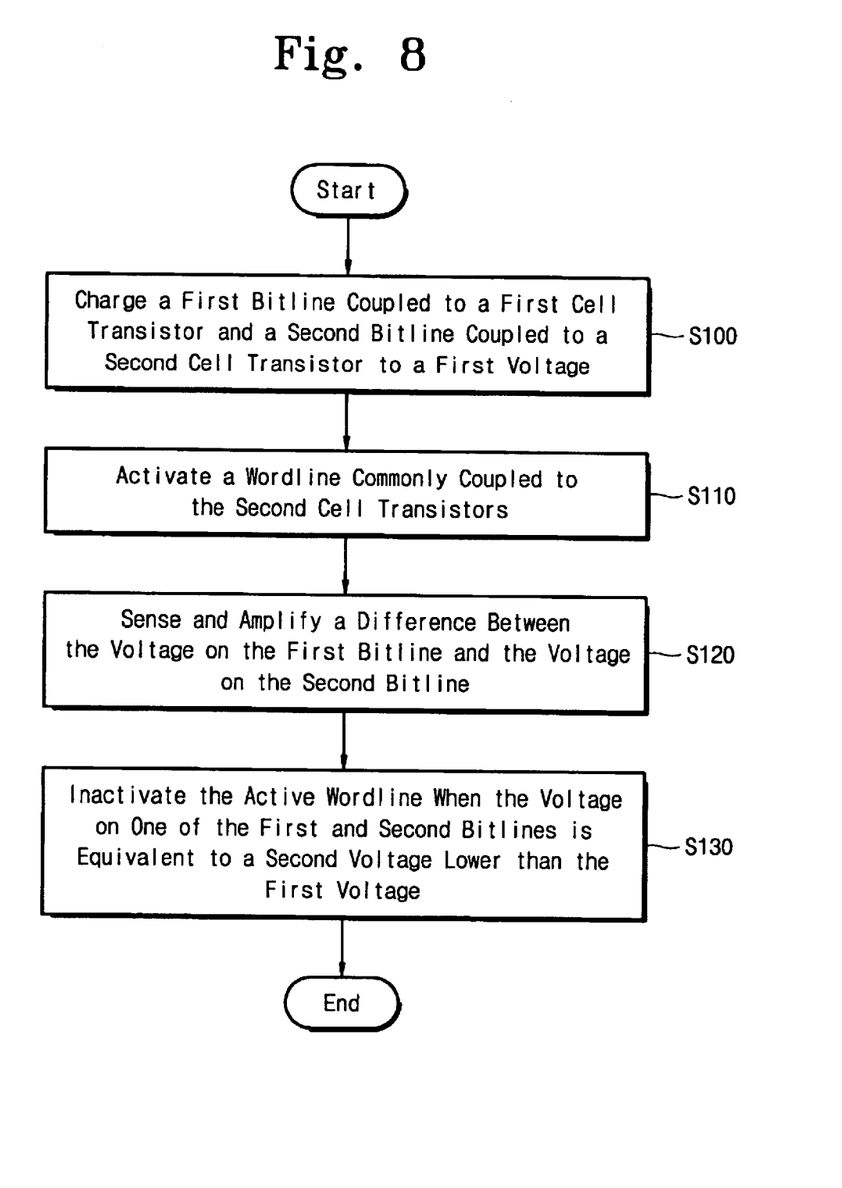
FIG. 8 is a flowchart of an operating method of the SRAM device according to an embodiment of the present invention.

A read operation of the SRAM device according to the invention is explained with reference to a flowchart of FIG. 8. In step S100, a first bitline coupled to a first cell transistor and a second bitline coupled to a second cell transistor are charged to a first voltage. In step S110, a wordline commonly coupled to the first and second cell transistors is activated. A difference between the voltage on the first bitline and the voltage on the second bitline is sensed and amplified (S120). When the voltage on one of the first and second bitlines is equivalent to a second voltage lower than the first voltage, an activated wordline is inactivated (S130).

Figure 9:
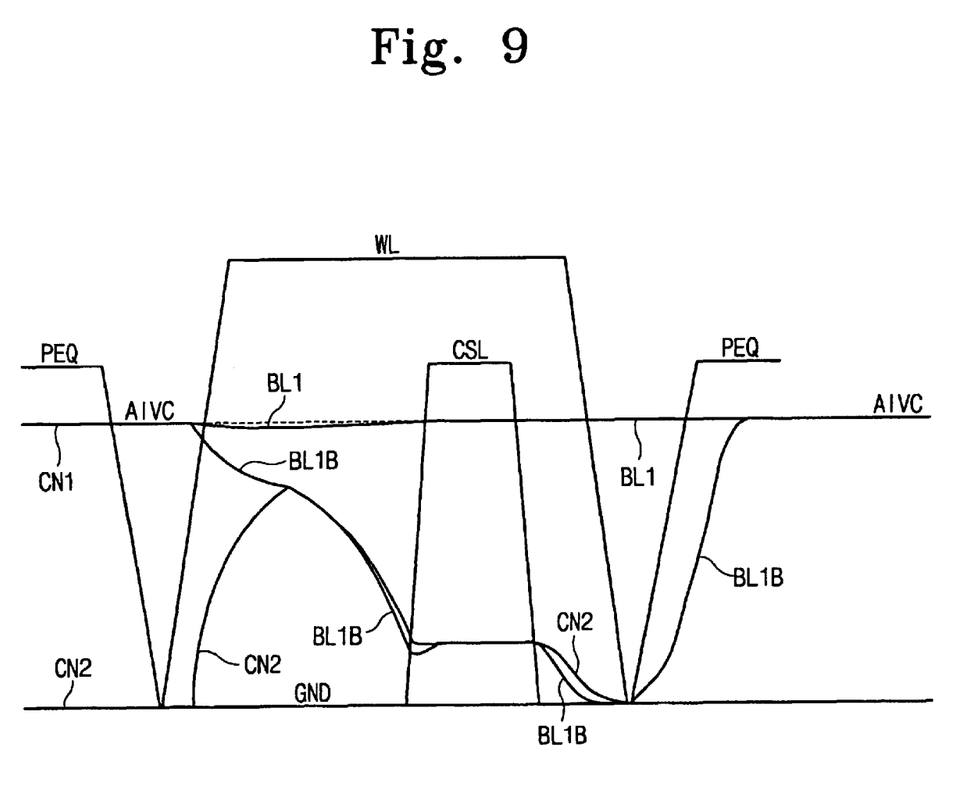
FIG. 9 shows voltage variation of cell nodes and voltage variation of bitlines in a refresh operation of a SRAM device according to an embodiment of the present invention.

FIG. 9 shows voltage variation of cell nodes and voltage variation of bitlines in a refresh operation of the SRAM device according to an embodiment of the invention. The SRAM device has a twin cell structure with two DRAM cells. For example, the SRAM device has one of the twin cell structures shown in FIG. 2 and FIG. 3. It is clear to a person skilled in the art that the SRAM device may adopt other cell structures that are different from those shown in FIG. 2 and FIG. 3. For convenience, under the assumption that the twin cell structure shown in FIG. 2 is adopted, the read operation of the SRAM device will now be described in more detail with reference to FIG. 6 through FIG. 9.

Referring to FIG. 9, bitlines (BL1, BL1B) are precharged to a bitline precharge voltage, i.e., a power supply voltage for an array (AIVC) through a bitline precharge section 141, while keeping a precharge control signal PEQ high. Assuming that cell data "1" is stored in one of DRAM cells (MC1, MC2) constituting a twin cell and cell data "0" is stored in the other, a cell node CN1 of the DRAM cell MC1 has a power supply voltage for an array (AIVC) and a cell node CN2 of the DRAM cell MC2 has a ground voltage.

As the precharge control signal is inactivated at logic low, a read operation starts and a wordline WL1 coupled to cell transistors of the DRAM cells (MC1, MC2) is activated (S120). The cell transistors of the DRAM cells (MC1, MC2) are turned on. Capacitors of the DRAM cells (MC1, MC2) are electrically connected to corresponding bitlines (BL1, BL1B) through turned-on cell transistors, respectively. Charge sharing is established between a DRAM cell having high-level data and the bitline BL1 precharged to the power supply voltage for an array (AIVC). Also charge sharing is established between a DRAM cell having low-level data and the bitline BL1B precharged to the power supply voltage for an array (AIVC).

In a DRAM cell having high-level data, since the cell node CN1 has the same voltage as the bitline precharge voltage (AIVC), there is a small voltage variation of the bitline BL1 after a charge sharing operation is completed, as shown in FIG. 9. On the other hand, in the case of a DRAM cell having low-level data, since the cell node CN2 has the ground voltage, there is a great voltage variation of the bitline BL1B after the charge sharing operation is completed, as also shown in FIG. 9. As a result, at the operating point of the sense amplifier, the bitline BL1 has the power supply voltage for an array (AIVC) and the bitline BL1B has voltage of (AIVC-2ΔVBL).

If the voltage difference between the bitlines (BL1, BL1B) becomes sufficient as a result of the charge sharing, a sense amplifier 12 is activated. Thus, the voltage of the bitline BL1 increases toward the power supply voltage for an array (AIVC), and the voltage of the bitline BL1B decreases toward the ground voltage. Simultaneously, the cell nodes (CN1, CN2) of the DRAM cells (MC1, MC2) are charged to voltages of the bitlines (BL1, BL1B). That is, such that an active re-storing operation is performed.

As a column selection line is activated, the voltages on the bitlines are applied to corresponding input/output lines (IO1, IO1B) through switch transistors (M109, M110). Since an input/output line having a high loading capacitance is precharged to an internal power supply voltage IVC, voltages of the bitline BL1B and the cell node CN1, which drop toward the ground voltage, are clamped to a specific voltage level, as shown in FIG. 9. In this case, the voltages of the bitline BL1 and the cell node CN1 are scarcely affected by the activation of the column selection line. Following the inactivation of the column selection line, an activated wordline WL1 is inactivated when voltage of the bitline BL1B corresponding to the low-level data reaches the ground voltage.

According to the read operation of the SRAM device, the wordline WL1 is inactivated at a point when a cell node CN2 of the DRAM cell corresponding to the low-level data is recharged to the ground voltage. In the read operation, the point when the cell node of a DRAM cell storing cell data "1" is sufficiently recharged leads the point when the cell node of a DRAM cell storing cell data "0" is recharged to the ground voltage. For this reason, if a wordline is inactivated at the point when the cell node of the DRAM cell storing the cell data "0" is sufficiently recharged to the ground voltage, a wordline activation period of the twin cell structure becomes short.

Briefly, if bitlines are precharged to a power supply voltage for an array, a wordline activation period is reduced by a time difference Δt (see FIG. 5) between re-storing finish points of low-level data and high-level data.

An access time and speed of the SRAM device according to an embodiment of the present invention can be reduced and improved by means of the above-described read operation. This improvement will be explained in detail below.

As described above, an SRAM device adopting a twin cell structure internally carries out a refresh operation without an external command. Therefore, although a read/write command is inputted, it is necessary to secure a refresh time of one cycle. For instance, when an external command for the read/write operation is inputted, an access operation is typically carried out after securing the refresh operation that is internally carried out. As a result, the time required for one access operation is doubled.

Figure 10:
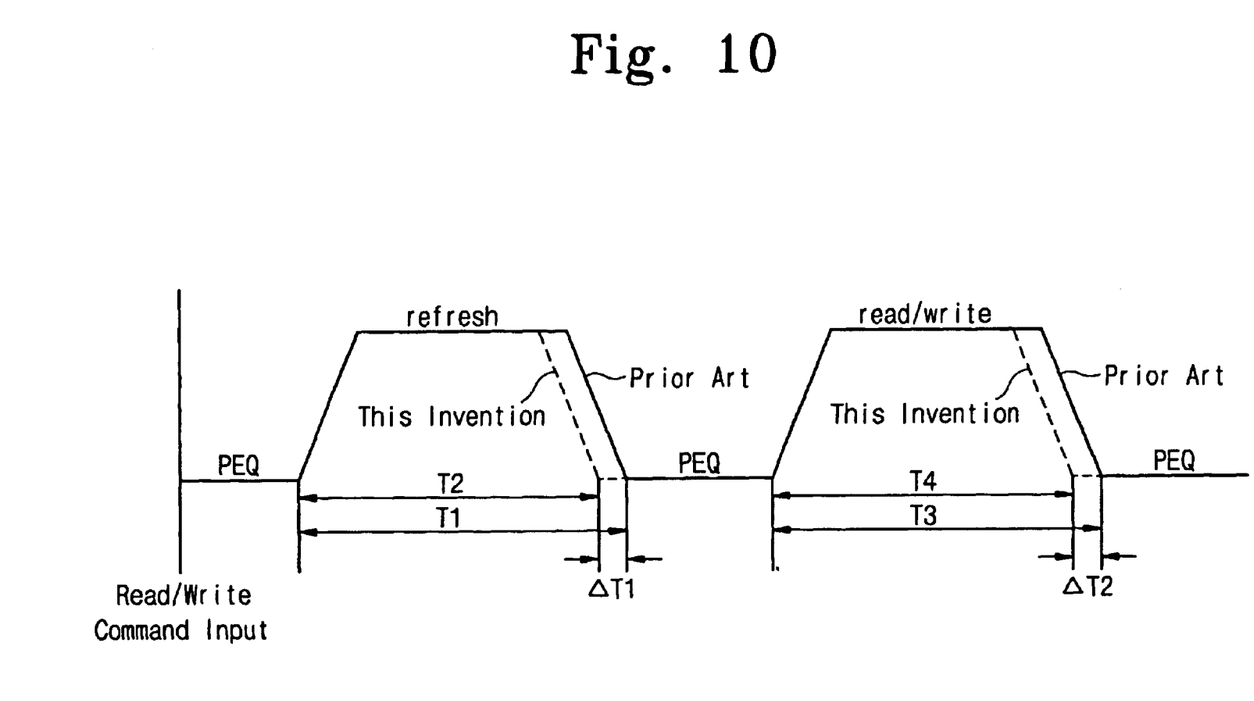
FIG. 10 shows a shortened access time of an SRAM device according to an embodiment of the present invention.

In the case of the SRAM device shown in FIG. 4, a wordline activation time (T1) for a refresh operation and a wordline activation time (T3) for read/write operations are necessary for one access operation, as shown in FIG. 10. In the case of the SRAM device according to an embodiment of the present invention, a wordline activation time (T2) for a refresh operation and a wordline activation time (T4) for read/write operations are necessary for one access operation. In this embodiment, since the wordline activation period of the SRAM device is shorter than that of the conventional SRAM device shown in FIG. 4, the wordline activation time for the refresh operation is reduced by ΔT1 and the wordline activation time for the read/write operations is reduced by ΔT2. Conclusionally, an entire row access time of the SRAM device is reduced by ΔT1+ΔT2. Thus, an access speed thereof can be enhanced. One skilled in the art appreciates that a write operation can obtain the same effect.

By precharging a bitline to a power supply voltage for an array, advantages to be obtained are as follows:

(1) Since a gate voltage of an NMOS transistor constituting a bitline sense amplifier is coupled to a bitline having a power supply voltage (AIVC), a sensing operation of the sense amplifier is quicker, as compared to a bitline having half the voltage of AIVC;

(2) In the case of an SRAM device where a bitline is precharged to an half voltage of AIVC, sense noise is present at both bitlines when a sense amplifier operates. On the other hand, in the case of an SRAM device where a bitline is precharged to voltage of AIVC, the sense noise occurs only at a bitline having a ground voltage. Therefore, a sensing operation is stably carried out;

(3) As the voltage potential of a bitline coupled to a memory cell of high-level data increases, current supplied to a bitline through a PMOS driver is reduced. Current supplied to a bitline coupled to a memory cell of low-level data is nearly the same. For this reason, a difference of the current supplied to bitlines becomes high. Thus, a column selection signal is more quickly activated, thereby resulting in an enhanced read speed; and (4) As compared to a conventional driver circuit shown in FIG. 4, a driver circuit according to an embodiment of the present invention shown in FIG. 7 has a comparatively simple construction. Thus, the chip size is reduced.

While the present invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of controlling operations of a static random access memory device, comprising:

charging a first bitline coupled to a first cell transistor and a second bitline coupled to a second cell transistor to a first voltage;

activating a wordline commonly coupled to the first and second cell transistors;

sensing and amplifying a difference between voltage on the first bitline and voltage on the second bitline; and inactivating an activated wordline when the voltage on one of the first and second bitlines is substantially the same as a second voltage.

2. The method as recited in claim 1, wherein the first voltage is a power supply voltage for an array and the second voltage is a ground voltage.

3. The method as recited in claim 1, wherein the charging step is performed after or before a read, write or refresh operation.

4. The method as recited in claim 1, wherein the method further comprises an active re-storing operation which is performed while sensing and amplifying the difference between the voltages on the first and second bitlines.

5. The method as recited in claim 1, wherein the first bitline is coupled to a first cell capacitor through the first cell transistor and the second bitline is coupled to a second cell capacitor through the second cell transistor; and wherein the first cell transistor and the first cell capacitor constitute a first memory cell, the second cell transistor and the second cell capacitor constitute a second memory cell, and the first and second memory cells constitute a twin cell.

6. The method as recited in claim 5, wherein the first and second memory cells store complementary data.

7. A method of controlling operations of a static random access memory, comprising:

charging a first bitline coupled to a first cell transistor and a second bitline coupled to a second cell transistor to a first voltage;

activating a wordline commonly coupled to the first and second cell transistors;

sensing and amplifying a difference between voltage on the first bitline and voltage on the second bitline;

transferring amplified voltages on the first and second bitlines to corresponding input/output lines; and inactivating an activated wordline when the voltage on one of the first and second bitlines is substantially the same as a second voltage, wherein the first voltage is a power supply voltage for an array and the second voltage is a ground voltage.

8. The method as recited in claim 7, wherein an operation of the charging is performed after or before a read, write or refresh operation.

9. The method as recited in claim 7, wherein an active re-storing operation is performed while sensing and amplifying the difference between the voltages on the first and second bitlines.

10. The method as recited in claim 7, wherein the first bitline is coupled to a first cell capacitor through the first cell transistor and the second bitline is coupled to a second cell capacitor through the second cell transistor; and wherein the first cell transistor and the first cell capacitor constitute a first memory cell, the second cell transistor and the second cell capacitor constitute a second memory cell, and the first and second memory cells constitute a twin cell.

11. A static random access memory comprising:

a plurality of twin cells each having a first memory cell and a second memory cell, the twin cells being arranged in a matrix of rows and columns;

a row selection circuit for activating one of the rows in response to a row address;

a bitline precharge circuit for charging first and second bitlines of each column to a power supply voltage in response to a precharge control signal; and a sense amplifier circuit for sensing and amplifying a voltage difference between the first and second bitlines of each column, wherein the row selection circuit inactivates the activated row when a voltage on one of the first and second bitlines of each column reaches a ground voltage.

12. The device as recited in claim 11, wherein the first bitline is coupled to a first cell capacitor through the first cell transistor and the second bitline is coupled to a second cell capacitor through the second cell transistor; and wherein the first cell transistor and the first cell capacitor constitute a first memory cell, the second cell transistor and the second cell capacitor constitute a second memory cell, and the first and second memory cells constitute a twin cell.

13. The device as recited in claim 11, wherein the sense amplifier circuit is coupled to the first bitline, the second bitline, the power supply voltage, and a signal line which is driven by a line driver to have one of the power supply voltage and the ground voltage.

14. The device as recited in claim 13, wherein the power supply voltage is used in an array having the twin cells.

* * * * *